United States Patent
Etoh

(10) Patent No.: US 7,138,866 B2
(45) Date of Patent: Nov. 21, 2006

(54) OPERATIONAL AMPLIFIER INCLUDING LOW DC GAIN WIDEBAND CIRCUIT AND HIGH DC GAIN NARROWBAND GAIN CIRCUIT

(75) Inventor: Toshiyuki Etoh, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 111 days.

(21) Appl. No.: 11/041,426

(22) Filed: Jan. 25, 2005

(65) Prior Publication Data

US 2005/0162232 A1 Jul. 28, 2005

(30) Foreign Application Priority Data

Jan. 26, 2004 (JP) ............................. 2004-017570

(51) Int. Cl.
*H03F 3/45* (2006.01)

(52) U.S. Cl. ...................................... 330/253; 330/257

(58) Field of Classification Search ................ 330/253, 330/257, 259
See application file for complete search history.

(56) References Cited

U.S. PATENT DOCUMENTS 6,583,668 B1 * 6/2003 Liu et al. ..................... 330/254
6,657,495 B1 * 12/2003 Ivanov et al. ................ 330/255

OTHER PUBLICATIONS

Germano Nicollini, et al., A Fully Differential Sample-and-Hold Circuit for High-Speed Applications, IEEE Journal of Solid-State Circuits, vol. 24, No. 5, pp. 1461-1465, Oct. 1989.
Thomas Byunghak Cho, et al., "A 10 b, 20 Msample/s, 35 mW Pipeline A/D Converter", IEEE Journal of Solid-State Circuits, vol. 30, No. 3, pp. 166-172, Mar. 1995.

* cited by examiner

*Primary Examiner*—Robert Pascal
*Assistant Examiner*—Hieu Nguyen
(74) *Attorney, Agent, or Firm*—McGinn IP Law Group, PLLC

(57) ABSTRACT

In an operational amplifier including first and second power supply terminals, first and second input terminals, and first and second output terminals, a first differential amplifier circuit including a first drive cascode circuit and a first tail current source amplifies first and second input signals supplied to the first and second input terminals and transmits the amplified first and second input signals to the second and first output terminals, respectively, and a second differential amplifier circuit including a second drive cascode circuit and a second tail current source amplifies the first and second input signals. Also, a first circuit is connected between the first output terminal and the second power supply terminal so that the first circuit serves as an input-stage load or an output drive circuit, and a second circuit is connected between the second output terminal and the second power supply terminal so that the second circuit serves as an input-stage load or an output drive circuit. A first input-stage load circuit is connected between a first terminal of the second drive cascode circuit and the second power terminal, and a second input-stage load circuit is connected between a second terminal of the second drive cascode circuit and the second power terminal.

16 Claims, 3 Drawing Sheets

OPERATIONAL AMPLIFIER INCLUDING LOW DC GAIN WIDEBAND CIRCUIT AND HIGH DC GAIN NARROWBAND GAIN CIRCUIT

BACKGROUND OF THE INVENTION

1. Field of the Invention

The present invention relates to a high DC gain wideband operational amplifier operable at a low operating voltage.

2. Description of the Related Art

A prior art operational amplifier is constructed by a drive cascode circuit connected to output terminals including a differential pair for receiving differential input voltages, a tail current source connected between the differential pair and a ground terminal, and a load cascode circuit connected between a power supply terminal and the output terminals for generating constant load currents (see: Germano Nicollini et al., "A Fully Differential Sample-and-Hold Circuit for High-Speed Applications", IEEE Journal of Solid-State Circuits, Vol. 24, No. 5, pp. 1461–1465, October 1989). This will be explained later in detail.

In the above-described prior art operational amplifier, however, a high DC gain cannot be realized, and also the minimum operating voltage is relatively high so that the power consumption would be increased.

Note that, in order to increase the DC gain, triple cascode circuits may be used instead of the above-mentioned cascode circuits; in this case, however, the dynamic output range would be decreased. Also, in order to increase the DC gain, gain boost circuits can be connected to the above-mentioned cascode circuits; in this case, however, the integration would be degraded and the power consumption would be increased. Regarding "gain boost circuits", refer to T. B. Chuo et al., FIG. 6 of "A 10b, 20 Msample/s, 35 mW Pipeline A/D converter", IEEE Journal of Solid-State Circuits, Vol. 30, No. 3, pp. 166–172, March 1995.

SUMMARY OF THE INVENTION

It is an object of the present invention to provide a high DC gain wideband operational amplifier operable at a low operating voltage.

According to the present invention, in an operational amplifier including first and second power supply terminals, first and second input terminals, and first and second output terminals, a first differential amplifier circuit including a first drive cascode circuit and a first tail current source amplifies first and second input signals supplied to the first and second input terminals and transmits the amplified first and second input signals to the first and second output terminals, respectively, and a second differential amplifier circuit including a second drive cascode circuit and a second tail current source amplifies the first and second input signals. Also, a first circuit is connected between the first output terminal and the second power supply terminal so that the first circuit serves as an input-stage load or an output drive circuit, and a second circuit is connected between the second output terminal and the second power supply terminal so that the second circuit serves as an input-stage load or an output drive circuit. A first input-stage load circuit is connected between a first terminal of the second drive cascode circuit and the second power terminal, and a second input-stage load circuit is connected between a second terminal of the second drive cascode circuit and the second power terminal.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art operational amplifier will be explained with reference to FIG. 1 (see: Germano Nicollini et al., "A Fully Differential Sample-and-Hold Circuit for High-Speed Applications", IEEE journal of Solid-State Circuits, Vol. 24, No. 5, pp. 1461–1465, October 1989).

Figure 1:
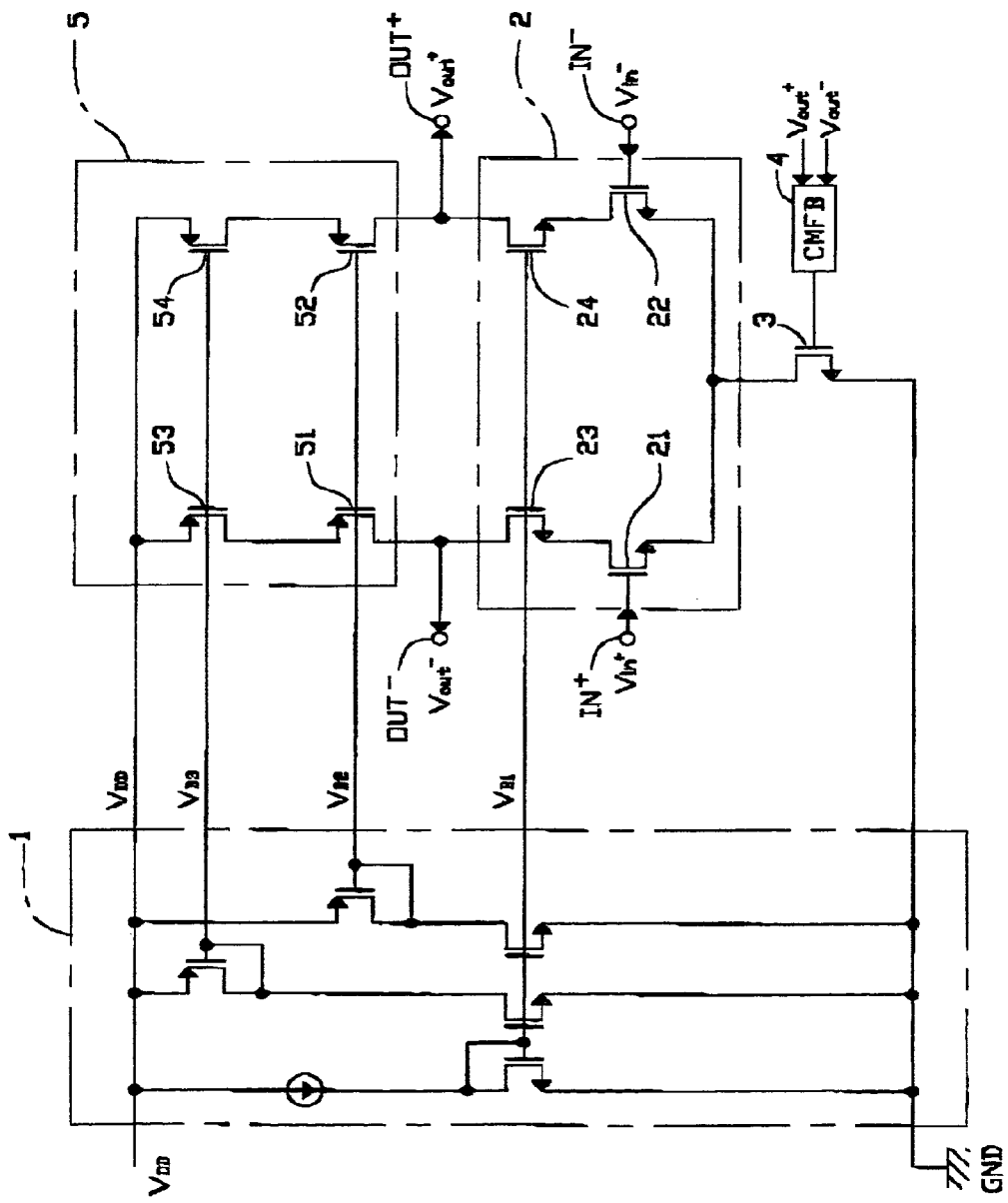
FIG. 1 is a circuit diagram illustrating a prior art operational amplifier.

FIG. 1 shows a telescopic cascode operational amplifier which receives differential input voltages $V_{in}^+$ and $V_{in}^-$ at input terminals IN$^+$ and IN$^-$, respectively, and generates differential output voltages $V_{out}^+$ and $V_{out}^-$ at output terminals OUT$^+$ and OUT$^-$, respectively.

A bias circuit 1 receives a ground voltage GND and a power supply voltage $V_{DD}$ to generate bias voltages $V_{B1}$, $V_{B2}$ and $V_{B3}$ where GND<$V_{B1}$ and $V_{B2}$<$V_{B3}$<$V_{DD}$.

A differential amplifier circuit formed by a drive cascode circuit 2 associated with an N-channel MOS transistor 3 serving as a tail current source is connected between the output terminals OUT$^-$ and OUT$^+$ and a ground terminal to which the ground voltage GND is applied. Also, the gate of the N-channel MOS transistor 3 is controlled by a common mode feedback circuit 4. Further, a load cascode circuit 5 is connected between a power supply terminal to which the power supply voltage $V_{DD}$ is applied and the output terminals OUT$^-$ and OUT$^+$.

The drive cascode circuit 2 is constructed by N-channel MOS transistors 21, 22, 23 and 24 The N-channel MOS transistors 21 and 22 forming a differential pair have gates adapted to receive the input voltages $V_{in}^+$ and $V_{in}^-$, respectively, and the N-channel MOS transistors 23 and 24 have gates adapted to receive the bias voltage $V_{B1}$.

The load cascode circuits 5 is constructed by P-channel MOS transistors 51 and 52 with gates adapted to receive the bias voltage $V_{B2}$ and P-channel MOS transistors 53 and 54 with gates adapted to receive the bias voltage $V_{B3}$. The drains of the P-channel MOS transistors 51 and 52 are connected to the output terminals OUT$^-$ and OUT$^+$, respectively, while the common source of the P-channel MOS transistors 53 and 54 is connected to the power supply terminal ($V_{DD}$). Thus, the load cascode circuit 5 generates constant load currents which are the same as each other.

Thus, the differential output voltages $V_{out}^+$ and $V_{out}^-$ are generated in accordance with the differential input voltages $V_{in}^+$ and $V_{in}^-$. In this case, the tail current of the N-channel MOS transistor 3 is controlled by the common mode feedback circuit 4 which receives the output voltages $V_{out}^+$ and $V_{out}^-$, so that the intermediate voltage or common mode voltage between the differential output voltages $V_{out}^+$ and $V_{out}^-$ is brought close to a predetermined value such as $V_{DD}/2$.

In the operational amplifier of FIG. 1, since the output impedance of the load cascode circuit 5 is high, the DC gain can be increased to several thousands. Also, since the differential input voltages $V_{in}^+$ and $V_{in}^-$ are transmitted only through the N-channel MOS transistors 21 to 24, wideband characteristics can be realized. Further, the operational amplifier or FIG. 1 is simple and less power-consuming.

In the operational amplifier of FIG. 1, although a high precision operational amplifier requires a DC gain of about 10000 (80 dB), such a high DC gain cannot be realized, since the DC gain of the operational amplifier of FIG. 1 depends upon a product of the transconductance gm of the N-channel MOS transistor 21 (22) and a combined resistance of a parallel connection between the output impedance of the load cascode circuit 5 and the output resistance of the drive cascode circuit 2.

Also, in the operational amplifier of FIG. 1, the minimum operating voltage is relatively large so that the power consumption would be increased. That is, in FIG. 1, the minimum operating voltage is determined by a saturation voltage such as 0.25V of each of the transistors 21 (22), 23(24), 51(52), 53(54) and 3 plus a peak-to-peak voltage swing such as 0.5 $V_{p-p}$ of the output voltages $V_{out}^+$ and $V_{out}^-$ i.e., about 1.75 Vtyp (=0.25×5+0.5), which would increase the power consumption.

Figure 2:
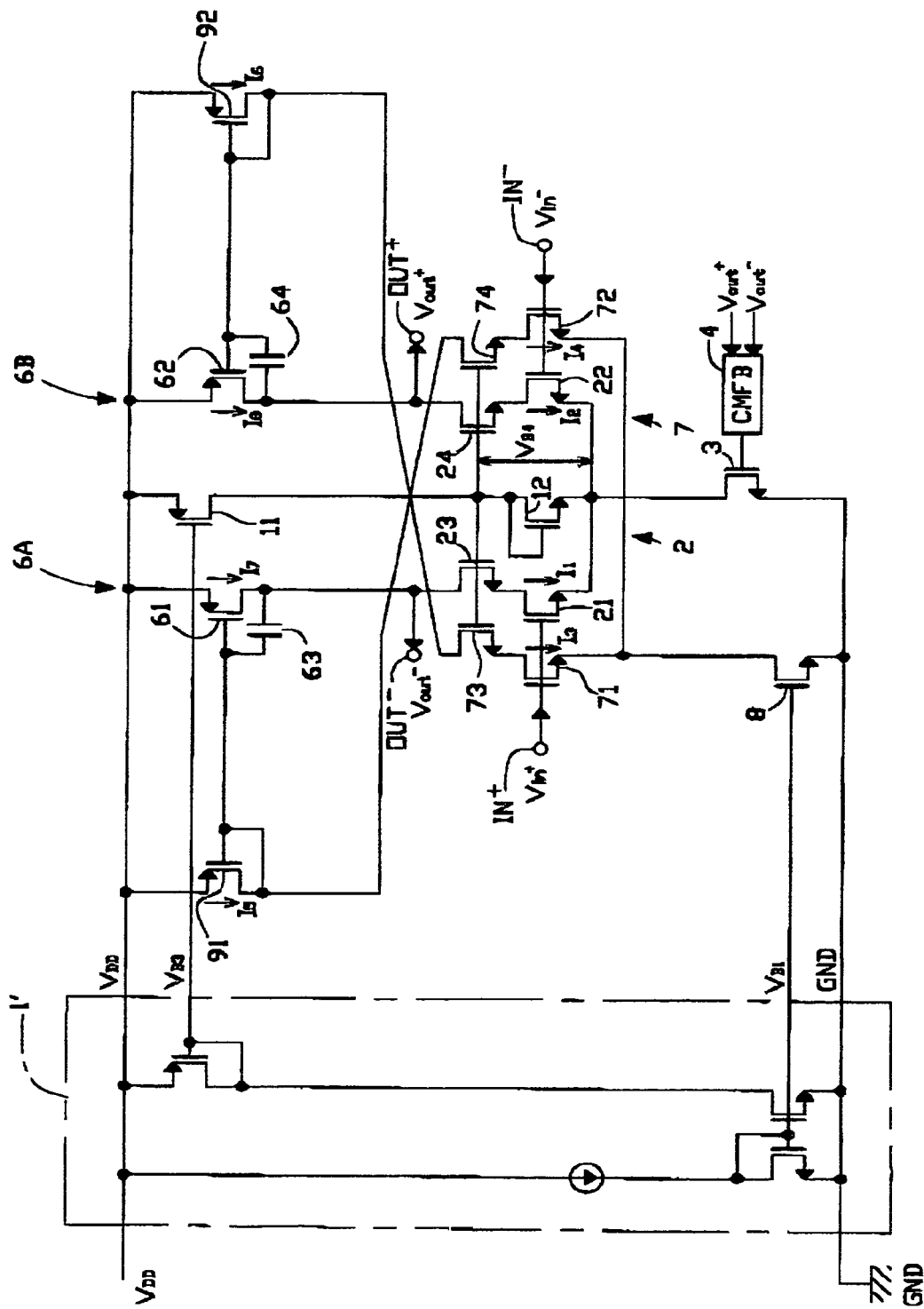
FIG. 2 is a circuit diagram illustrating a first embodiment of the operational amplifier according to the present invention.

In FIG. 2, which illustrates a first embodiment of the operational amplifier according to the present invention, the bias circuit 1 of FIG. 1 is modified to a bias circuit 1' which generates only the bias voltages $V_{B1}$ and $V_{B3}$. Also, the load cascode circuit 5 of FIG. 1 is replaced by input-stage load/output drive circuits 6A and 6B. Also, a drive cascode circuit 7, an N-channel MOS transistor 8 serving as a tail current source, and diode-connected P-channel MOS transistors 91 and 92 are added to the elements of FIG. 1.

The input-stage load/output drive circuits 6A(6B) is constructed by a P-channel MOS transistor 61(62) serving as a grounded-source type amplifier, and a phase compensation capacitor 63(64) connected between the output terminal $OUT^-$ ($OUT^+$) and the gate of the P-channel MOS transistor 61(62).

A differential amplifier formed by a drive cascode circuit 7 associated with an N-channel MOS transistor 8 serving as a tail current source is connected to the ground terminal (GND). The bias voltage $V_{B1}$ is applied to the gate of the N-channel MOS transistor 8.

The P-channel MOS transistors 61(62) and 91(92) form a current mirror circuit whose input is connected to the drains of the N-channel MOS transistors 74 and 73, respectively.

Note that a P-channel MOS transistor 11 serving as a current bias source, and an N-channel MOS transistor 12 defines a bias voltage $V_{B4}$ for the N-channel MOS transistors 23, 24, 73 and 74.

A low DC gain wideband feed forward circuit is realized by the drive cascode circuit 2 (the N-channel MOS transistors 21, 22, 23 and 24) serving as input drive circuits associated with the tail current source 3, and the P-channel MOS transistors 61 and 62 serving as input-stage loads. That is, the input voltage $V_{in}^+$ is amplified by the N-channel MOS transistor 21 to change a current $I_1$ flowing through the N-channel MOS transistors 21 and 23, i.e., the output voltage $V_{out}^-$. Thus, the input voltage $V_{in}^+$ is amplified by one transistor, i.e., the N-channel MOS transistor 21 in this low DC gain wideband feed forward circuit, so that the higher the input voltage $V_{in}^+$, the lower the output voltage $V_{out}^-$, while the lower the input voltage $V_{in}^+$, the higher the output voltage $V_{out}^-$. On the other hand, the input voltage $V_{in}^-$ is amplified by the N-channel MOS transistor 22 to change a current $I_2$ flowing through the N-channel MOS transistors 22 and 24, i.e., the output voltage $V_{out}^+$. Thus, the input voltage $V_{in}^-$ is amplified by one transistor, i.e., the N-channel MOS transistor 22 in this low DC gain wideband feed forward circuit, so that the higher the input voltage $V_{in}^-$ the lower the output voltage $V_{out}^+$ while the lower the input voltage $V_{in}^-$ the higher the output voltage $V_{out}^+$.

A high DC gain narrowband circuit is realized by the drive cascode circuit 7 (the N-channel MOS transistors 71, 72, 73 and 74) serving as input drive circuits associated with the tail current source 8, the P-channel MOS transistors 91 and 92 serving as input-stage loads, the P-channel MOS transistors 61 and 62 serving as output drive circuits, and the drive cascode circuit 2 (the N-channel MOS transistors 21, 22, 23 and 24) serving as output loads associated with the tail current source 3. That is, the input voltage $V_{in}^+$ is amplified by the N-channel MOS transistor 71 to change a current $I_3$ flowing through the N-channel MOS transistors 71 and 73. Then, the current $I_3$ is amplified by the P-channel MOS transistors 92 and 62 to change a current $I_6$ therethrough, i.e., a current $I_8$ flowing through the P-channel MOS transistor 62. As a result, the output voltage $V_{out}^+$ is changed. Thus, the input voltage $V_{in}^+$ is amplified by three transistors, i.e., the N-channel MOS transistor 71 and the P-channel MOS transistors 92 and 62 in this high DC gain narrowband circuit, so that the higher the input voltage $V_{in}^+$, the higher the output voltage $V_{out}^+$ while the lower the input voltage $V_{in}^+$, the lower the output voltage $V_{out}^+$. On the other hand, the input voltage $V_{in}^-$ is amplified by the N-channel MOS transistor 72 to change a current $I_4$ flowing through the N-channel MOS transistors 72 and 74, Then, the current $I_4$ is amplified by the P-channel MOS transistors 91 and 61 to change a current $I_5$ therethrough, i.e., a current $I_7$ flowing through the P-channel MOS transistor 61. As a result, the output voltage $V_{out}^-$ is changed. Thus, the input voltage $V_{in}^-$ is amplified by three transistors, i.e., the N-channel MOS transistor 72 and the P-channel MOS transistors 91 and 61 in this high DC gain circuit, so that the higher the input voltage $V_{in}^-$, the higher the output voltage $V_{out}^-$, while the lower the input voltage $V_{in}^-$, the lower the output voltage $V_{out}^-$.

In FIG. 2, the low DC gain wideband feed forward circuit is connected in parallel with the high DC gain narrowband circuits, so that the operational amplifier of FIG. 2 becomes a high DC gain wideband one.

Figure 3:
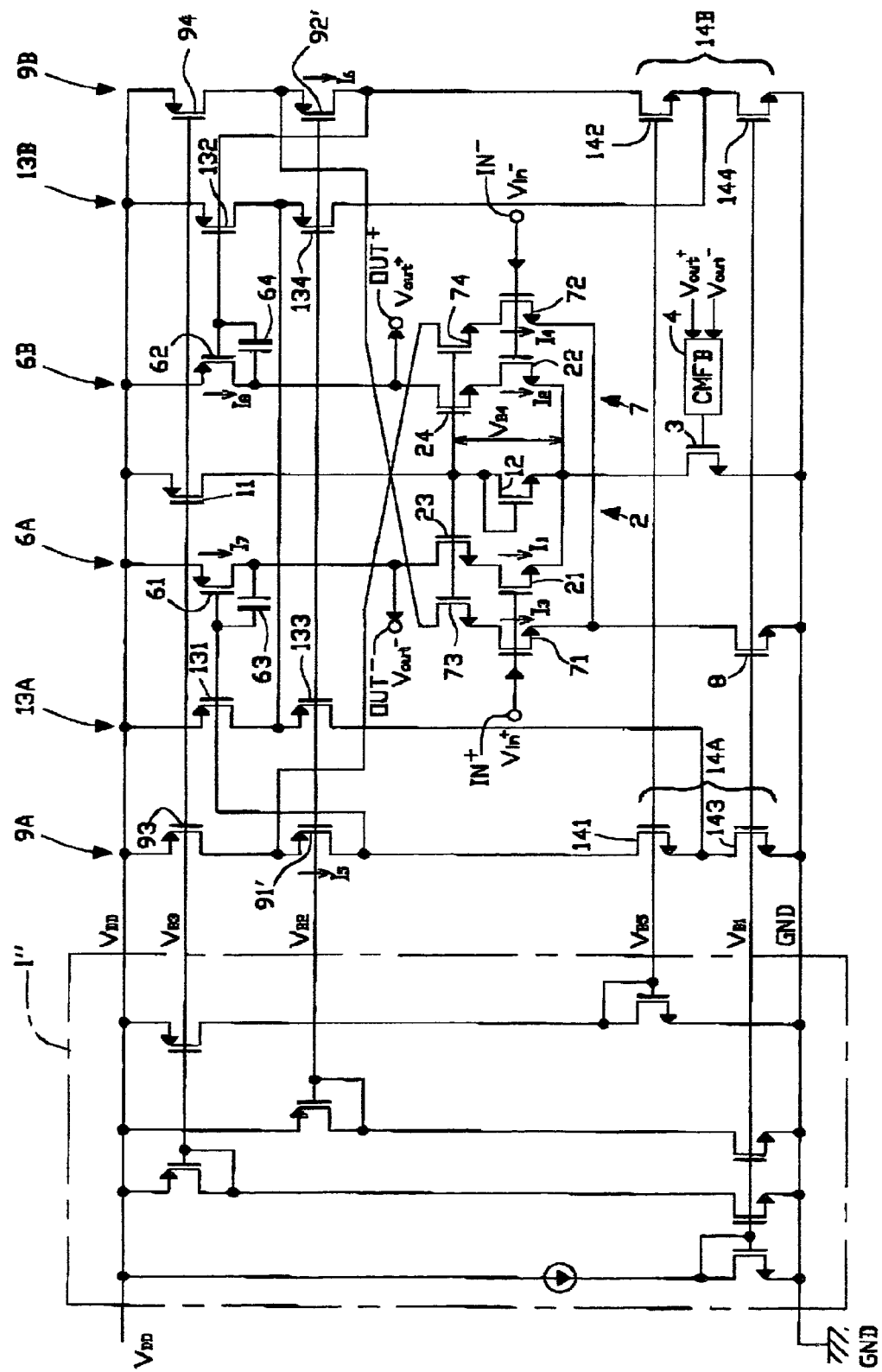
FIG. 3 is a circuit diagram illustrating a second embodiment of the operational amplifier according to the present invention.

In FIG. 3, which illustrates a second embodiment of the operational amplifier according to the present invention, the bias circuit 1 of FIG. 1 is modified to a bias circuit 1" which generates a bias voltage $V_{B5}$ in addition to the bias voltages $V_B$, $V_{B2}$, and $V_{B3}$. Also, folded cascode circuits 9A and 9B are provided instead of the P-channel MOS transistors 91 and 92, respectively, of FIG. 2, and cascode circuits 13A and 13B and load cascode circuits 14A and 14B are added.

The folded cascode circuit 9A(9B) is constructed by a P-channel MOS transistor 91'(92') for folding a differential current flowing through the N-channel MOS transistors 72 and 74 (71 and 73) toward the P-channel MOS transistor 61(62) and a P-channel MOS transistor 93(94) serving as a current bias source. The bias voltages $V_{B2}$ and $V_{B3}$ are applied to the gates of the P-channel MOS transistors 91'(92') and 93(94), respectively.

Note that the load cascode circuit 14A (14B) corresponds to the P-channel MOS transistor 91(92) of FIG. 2.

The cascode circuits 13A and 14A form a local negative feedback loop within one high DC gain narrowband circuit, and the cascode circuits 13B and 14B form a local negative feedback loop within the other high DC gain narrowband circuit. The two local negative feedback loops are connected to each other, so that the common mode voltage components at the gate of the P-channel MOS transistors 61 and 62 would be compensated for. Thus, the bias currents flowing through the P-channel MOS transistors 61 and 62 can be stabilized.

In more detail, the cascode circuit 13A (13B) is constructed by a P-channel MOS transistor 131 (132) with a source connected to the power supply terminal ($V_{DD}$) and a gate connected to the drain of the P-channel MOS transistor 91' (92'), a P-channel MOS transistor 133 (134) with a source connected to the drain of the P-channel MOS transistor 131 (132) and a gate for receiving the bias voltage $V_{B2}$. Also, the load cascode circuit 14A (14B) is constructed by a N-channel MOS transistor 141 (142) with a drain connected to the drain of the P-channel MOS transistor 91' (92') and a gate for receiving the bias voltage $V_{B5}$, and an N-channel MOS transistor 143 (144) with a drain connected to the source of the N-channel MOS transistor 141 (142), a gate for receiving the bias voltage $V_{B1}$ and a source connected to the ground terminal (GND). In this case, the drain of the P-channel MOS transistor 133 (134) is connected to the source of the N-channel MOS transistor 141 (142) and the drain of the N-channel MOS transistor 143 (144). Also, a node between the drain of the P-channel MOS transistor 131 and the source of the P-channel MOS transistor 133 is connected to a node between the drain of the P-channel MOS transistor 132 and the source of the P-channel MOS transistor 134.

In FIG. 3, a low DC gain wideband feed forward, circuit is realized in the same way as in FIG. 2. On the other hand, a high DC gain narrowband circuit is realized by the addition of the folded cascode circuit 9A (9B) and the load cascode circuit 14A (14B) serving as input-stage loads to the high DC gain narrowband circuit of FIG. 2.

Further, in FIGS. 2 and 3, in the same way as in FIG. 1, since the tail current of the N-channel MOS transistor 3 is controlled by the common mode feedback circuit 4, the common mode voltage or intermediate voltage between the differential output voltages $V_{out}^+$ and $V_{out}^-$ is brought close to a predetermined value such as $V_{DD}/2$.

In FIGS. 2 and 3, the minimum operating voltage is determined by a saturation voltage such as 0.25V of each of the transistors 21 and 23 (22 and 24), and 3 plus a peak-to-peak voltage such as $0.5V_{p-p}$ of the output voltage $V_{out}^+$ and $V_{out}^-$, i.e., about 1.5 Vtype(=0.25×4+0.5), which is decreased by 0.25V as compared with the operational amplifier of FIG. 1, thus decreasing the power consumption.

According to the inventor's simulation, in the operational amplifier of FIG. 3, a consumption current of 1.1 mA and a DC gain of 98 dB were obtained under the condition where $V_{DD}$ was 3.3V, the unity gain frequency was 160 MHz and the load capacitance was 1.8 pF.

In FIGS. 2 and 3, the ground terminal (GND) and the power supply terminal ($V_{DD}$) can be replaced with each other. In this case, the N-channel MOS transistors are replaced by P-channel MOS transistors, and the P-channel MOS transistors are replaced by N-channel MOS transistors.

As explained hereinabove, according to the present invention, a high DC gain wideband operational amplifier with a low operating voltage can be obtained.

The invention claimed is:

1. An operational amplifier comprising:
  first and second power supply terminals;
  first and second input terminals;
  first and second output terminals;
  a first differential amplifier circuit including a first drive cascode circuit connected to said first and second output terminals and a first tail current source connected between said first drive cascode circuit and said first power supply terminal, said first differential amplifier circuit being adapted to amplify first and second input signals supplied to said first and second input terminals and transmitting said amplified first and second input signals to said second and first output terminals, respectively;
  a second differential amplifier circuit including a second drive cascode circuit and a second tail current source connected between said second drive cascode circuit said first power supply terminal, said second differential amplifier circuit being adapted to amplify said first and second input signals;
  a first circuit connected between said first output terminal and said second power supply terminal, said first circuit serving as an input-stage load and an output drive circuit;
  a second circuit connected between said second output terminal and said second power supply terminal, said second circuit serving as an input-stage load and an output drive circuit;
  a first input-stage load circuit, connected between a first terminal of said second drive cascode circuit and said second power supply terminal; and
  a second input-stage load circuit, connected between a second terminal of said second drive cascode circuit and said second power supply terminal.

2. The operational amplifier as set forth in claim 1, wherein said first tail current source comprises a first MOS transistor of a first conductivity type having a source connected to said first power supply terminal, a gate and a drain,
  said first drive cascode circuit comprising:
  a second MOS transistor of said first conductivity type having a source connected to the drain of said first MOS transistor, a gate adapted to receive said first input signal, and a drain;
  a third MOS transistor of said first conductivity type having a source connected to the drain of said first MOS transistor, a gate adapted to receive said second input signal, and a drain;
  a fourth MOS transistor of said first conductivity type having a source connected to the drain of said second MOS transistor, a gate adapted to receive a first bias voltage, and a drain connected to said first output terminal,
  a fifth MOS transistor of said first conductivity type having a source connected to the drain of said third MOS transistor, a gate adapted to receive said first bias voltage, and a drain connected to said second output terminal,
  said second tail current source comprising a sixth MOS transistor of said first conductivity type having a source connected to said first power supply terminal, a gate adapted to receive a second bias voltage, and a drain,
  said second drive cascode circuit comprising:
  a seventh MOS transistor of said first conductivity type having a source connected to the drain of said sixth MOS transistor, a gate adapted to receive said first input signal, and a drain;
  an eighth MOS transistor of said first conductivity type having a source connected to the drain of said sixth MOS transistor, a gate adapted to receive said second input signal, and a drain;

a ninth MOS transistor of said first conductivity type having a source connected to the drain of said seventh MOS transistor, a gate adapted to receive said first bias voltage, and a drain; and a tenth MOS transistor of said first conductivity type having a source connected to the drain of said eighth MOS transistor, a gate adapted to receive said first bias voltage, and a drain.

3. The operational amplifier as set forth in claim 2, wherein said first output amplifier comprises an eleventh MOS transistor of a second conductivity type having a source connected to said second power supply terminal, a gate, and a drain connected to said first output terminal, said second output amplifier comprising a twelfth MOS transistor of said second conductivity type having a source connected to said second power supply terminal, a gate, and a drain connected to said second output terminal.

4. The operational amplifier as set forth in claim 3, wherein said first input-stage load circuit comprises a thirteenth MOS transistor of a second conductivity type having a source connected to said second power supply terminal, a gate connected to the gate of said eleventh MOS transistor, and a drain connected to the drain of said tenth MOS transistor and the gate of said thirteenth MOS transistor, said second input-stage load circuit comprising a fourteenth MOS transistor of said second conductivity type having a source connected to said second power supply terminal, a gate connected to the gate of said twelfth MOS transistor, and a drain connected to the drain of said ninth MOS transistor and the gate of said fourteenth MOS transistor.

5. The operational amplifier as set forth in claim 3, wherein said first input-stage load circuit comprises a first folded cascode circuit including:

a thirteenth MOS transistor of said second conductivity type having a source connected to the drain of said tenth MOS transistor, a gate adapted to receive a third bias voltage, and a drain connected to the gate of said eleventh MOS transistor; and a fourteenth MOS transistor of said second conductivity type having a source connected to said second power supply terminal, a gate adapted to receive a fourth bias voltage, and a drain connected to the source of said thirteenth MOS transistor, said second input-stage load circuit comprising a second folded cascode circuit including:

a fifteenth MOS transistor of said conductivity type having a source connected to the drain of said ninth MOS transistor, a gate adapted to receive said third bias voltage, and a drain connected to the gate of said twelfth MOS transistor; and a sixteenth MOS transistor of said second conductivity type having a source connected to said second power supply terminal, a gate adapted to receive said fourth bias voltage, and a drain connected to the source of said fifteenth MOS transistor.

6. The operational amplifier as set forth in claim 2, wherein a low DC gain feed forward circuit is realized by said first drive cascode circuit serving as input drive circuits associated with said first tail current source, and said first and second output circuits serving as input-stage loads, wherein a high DC gain circuit is realized by said second drive cascode circuit serving as input drive circuits associated with said second tail current source, said first and second input-stage load circuits, said first and second output circuits, and said first drive cascode circuit serving as output loads associated with said first tail current source.

7. The operational amplifier as set forth in claim 2, further comprising a common mode feedback circuit connected between said first and second output terminals and the gate of said first MOS transistor, said common mode feedback circuit being adapted to controlling said first MOS transistor so that a common mode voltage component between said first and second output terminals is brought close to a predetermined value.

8. The operational amplifier as set forth in claim 5, further comprising:

a first local negative feedback loop connected between said first folded cascode circuit and said first circuit; and a second local negative feedback loop connected between said second folded cascode circuit and said second circuit;

said first and second local negative feedback loops being connected to each other, so that bias currents flowing through said first and second output circuits can be stabilized.

9. The operational amplifier as set forth in claim 8, wherein said first local negative feedback loop comprises:

a seventeenth MOS transistor of said second conductivity type having a source connected to said second power supply terminal, a gate connected to the drain of said thirteenth MOS transistor, and a drain;

an eighteenth MOS transistor of said second conductivity type having a source connected to the drain of said seventeenth MOS transistor, a gate adapted to receive said third bias voltage, and a drain;

a nineteenth MOS transistor of said first conductivity type having a drain connected to the drain of said thirteenth MOS transistor, a gate adapted to receive a fifth bias voltage, and a source connected to the drain of said eighteenth MOS transistor; and a twentieth MOS transistor of said first conductivity type having a drain connected to the source of said nineteenth MOS transistor, and a gate adapted to receive said second bias voltage, and a source connected to said first power supply terminal, said second local negative feedback loop comprising:

a twenty-first MOS transistor of said second conductivity type having a source connected to said second power supply terminal, a gate connected to the drain of said fifteenth MOS transistor, and a drain;

a twenty-second MOS transistor of said second conductivity type having a source connected to the drain of said twenty-first MOS transistor, a gate adapted to receive said third bias voltage, and a drain;

a twenty-third MOS transistor of said first conductivity type having a drain connected to the drain of said fifteenth MOS transistor, a gate adapted to receive said fifth bias voltage, and a source connected to the drain of said twenty-second MOS transistor; and a twenty-fourth MOS transistor of said first conductivity type having a drain connected to the source of said twenty-third MOS transistor, and a gate adapted to receive said second bias voltage, and a source connected to said first power supply terminal, the drain of said seventeenth MOS transistor being connected to the drain of said twenty-first MOS transistor.

10. An operational amplifier comprising:

a pair of first cascode N-channel MOS transistors associated with a first tail current source connected to a ground terminal, said first cascode N-channel MOS transistors being adapted to amplify a pair of differential input signals;

first and second P-channel MOS transistors each connected between one of said first cascode N-channel transistors and a power supply terminal;

a pair of second cascode N-channel MOS transistors associated with a second tail current source connected to said ground terminal, said second cascode N-channel MOS transistors being adapted to amplify said differential input signals; and third and fourth P-channel MOS transistors each connected between one of said second cascode N-channel transistors and said power supply terminal, said third and fourth P-channel MOS transistors forming mirror circuits with said first and second P-channel MOS transistors, respectively, wherein a feed forward circuit is realized by said first cascode N-channel MOS transistors serving as input drive circuits associated with said first tail current source, and said first and second P-channel MOS transistors serving as input-stage loads, and wherein a gain circuit is realized by said second cascode N-channel MOS transistors serving as input drive circuits associated with said second tail current source, said third and fourth P-channel MOS transistors serving as input-stage loads, said first and second P-channel MOS transistors serving as output drive circuits, and said first cascode N-channel MOS transistors serving as output loads associated with said second tail current source.

11. The operational amplifier as set forth in claim 10, wherein said feed forward circuits have low DC gain wideband characteristics, and said gain circuits have high DC gain narrowband characteristics.

12. An operational amplifier comprising:
a pair of first cascode N-channel MOS transistors associated with a first tail current source connected to a ground terminal, said first cascode N-channel MOS transistors being adapted to amplify a pair of differential input signals;

first and second P-channel MOS transistors each connected between one of said first cascode N-channel transistors and a power supply terminal;

a pair of second cascode N-channel MOS transistors associated with a second tail current source connected to said ground terminal, said second cascode N-channel MOS transistors being adapted to amplify said differential input signals;

a pair of folded cascode circuits formed by P-channel MOS transistors each connected between said second cascode N-channel transistors and said power supply terminal; and a pair of load cascode circuits formed by N-channel MOS transistors, each of said load cascode circuits being connected between said folded cascode circuits and said ground terminal, wherein a feed forward circuit is realized by said first cascode N-channel MOS transistors serving as input drive circuits associated with said first tail current source, and said first and second P-channel MOS transistors serving as input-stage loads, and wherein a gain circuit is realized by said second cascode N-channel MOS transistors serving as input drive circuits associated with said second tail current source, said folded cascode circuits and said load cascode circuits serving as input-stage loads, said first and second P-channel MOS transistors serving as output drive circuits, and said first cascode N-channel MOS transistors serving as output loads associated with said second tail current source.

13. The operational amplifier as set forth in claim 12, wherein said feed forward circuits have low DC gain wideband characteristics, and said gain circuits have high DC gain narrowband characteristics.

14. The operational amplifier as set forth in claim 12, further comprising a pair of local negative feedback loops each provided within one of said gain circuits, said local negative feedback loops being connected to each other to stabilize bias currents flowing through said first and second P-channel MOS transistors.

15. An operational amplifier comprising:
a first differential amplifier circuit including first cascoded MOS transistors of a first conductivity type and folded-cascoded MOS transistors of a second conductivity type to said first cascoded MOS transistors, said first differential amplifier circuit being adapted to amplify differential input signals;

a pair of output MOS transistors of said second conductivity type having sources connected to a first power supply terminal, gates of said output MOS transistors being adapted to receive amplified input signals from said first differential amplifier circuit so as to further amplify said amplified input signals to output differential output signals; and a second differential amplifier circuit including second cascode MOS transistors of said first conductivity type having drains connected to drains of said output MOS transistors, said second differential amplifier circuit being adapted to amplify said differential input signals, said first differential amplifier circuit and said output MOS transistors forming a first signal amplification path, said second differential amplifier circuit forming a second signal amplification path, thus constituting a parallel path structure by a gain path formed by said first signal amplification path and a feedforward path formed by said second signal amplification path.

16. The operational amplifier as set forth in claim 15, wherein said first differential amplifier circuit comprises:
a first current source MOS transistor of said first conductivity type having a source connected to a second power supply terminal;

first and second MOS transistors of said first conductivity type having sources connected to a drain of said first current source MOS transistor and gates adapted to receive said differential input signals;

third and fourth MOS transistors of said first conductivity type having sources connected to drains of said first and second MOS transistors, respectively, said first, second, third and fourth MOS transistors forming said first cascode MOS transistors;

fifth and sixth MOS transistors of said second conductivity type having sources connected to said first power supply terminal, gates adapted to receive a constant voltage, and drains connected to drains of said third and fourth MOS transistors, respectively; and seventh and eighth MOS transistors of said second conductivity type serving as said folded cascode MOS transistors, said seventh and eighth MOS transistors folding signal currents from said first cascoded MOS transistors by using said fifth and sixth MOS transistors as current bias sources, said second differential amplifier circuit comprising:
a second current source MOS transistor of said first conductivity type having a source connected to said second power supply terminal;
ninth and tenth MOS transistors of said first conductivity type having sources connected to a drain of said second current source MOS transistor and gates adapted to receive said differential input signals; and
eleventh and twelfth MOS transistors of said first conductivity type having sources connected to drains of said ninth and tenth MOS transistors, respectively, and drains connected to drains of said output MOS transistors, said ninth, tenth, eleventh and twelfth MOS transistors forming said second cascode MOS transistors.

* * * * *